US008831162B2

(12) United States Patent
Oda et al.

(10) Patent No.: US 8,831,162 B2
(45) Date of Patent: Sep. 9, 2014

(54) APPARATUS AND METHOD FOR MEASURING A TEMPERATURE OF COOLANT IN A REACTOR CORE, AND APPARATUS FOR MONITORING A REACTOR CORE

(75) Inventors: Naotaka Oda, Kanagawa (JP); Tadashi Miyazaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 11/520,785

(22) Filed: Sep. 14, 2006

(65) Prior Publication Data

US 2007/0201601 A1 Aug. 30, 2007

(30) Foreign Application Priority Data

Sep. 15, 2005 (JP) ................................. 2005-268214

(51) Int. Cl.
*G21C 17/112* (2006.01)
*G11C 17/12* (2006.01)
*G21C 17/00* (2006.01)

(52) U.S. Cl.
CPC ............ *G11C 17/12* (2012.01); *G21Y 2002/304* (2013.01); *G21Y 2002/204* (2013.01); *G21Y 2004/30* (2013.01); *G21Y 2002/302* (2013.01); *G21Y 2004/40* (2013.01)
USPC ............ 376/247; 376/245; 376/254; 376/259

(58) Field of Classification Search
USPC .......................................... 376/245, 247, 249
See application file for complete search history.

(56) References Cited

U.S. PATENT DOCUMENTS

| 4,313,792 A * | 2/1982 | Smith ............................ 376/247 |
| 4,406,011 A * | 9/1983 | Burns ............................ 376/247 |
| 4,425,297 A * | 1/1984 | Rolstad et al. ................ 376/247 |
| 4,440,716 A * | 4/1984 | Smith ............................ 376/247 |
| 4,459,045 A * | 7/1984 | Smith ............................ 374/132 |
| 4,521,373 A * | 6/1985 | Terhune et al. ............... 376/258 |
| 4,634,570 A * | 1/1987 | Jacquot et al. ................ 376/247 |
| 4,725,399 A * | 2/1988 | McCulloch et al. .......... 376/247 |
| 4,801,421 A * | 1/1989 | Ackerson et al. ............. 376/249 |
| 4,915,508 A * | 4/1990 | McCulloch et al. .......... 374/166 |
| 5,473,644 A * | 12/1995 | Yasuoka et al. .............. 376/254 |
| 5,490,184 A * | 2/1996 | Heibel .......................... 376/254 |
| 6,061,412 A * | 5/2000 | Stucker et al. ................ 376/217 |
| 6,236,689 B1 * | 5/2001 | Bech-Andersen ........... 375/334 |
| 6,310,929 B1 * | 10/2001 | Hirukawa .................... 376/245 |
| 6,915,237 B2 * | 7/2005 | Hashemian .................. 702/183 |

FOREIGN PATENT DOCUMENTS

| JP | 54-159589 A | 12/1979 |
| JP | 57-132085 A | 8/1982 |
| JP | 64-20493 A | 1/1989 |
| JP | 06-265686 A | 9/1994 |
| JP | 8-5772 A | 1/1996 |
| JP | 10-104388 A | 4/1998 |
| JP | 2001-099980 A | 4/2001 |
| JP | 2002-116280 A | 4/2002 |
| JP | 2004-85234 A | 3/2004 |
| JP | 3556409 B2 | 5/2004 |

\* cited by examiner

*Primary Examiner* — Bernarr Gregory
(74) *Attorney, Agent, or Firm* — Foley & Lardner LLP

(57) ABSTRACT

A reactor core coolant temperature measuring apparatus for measuring the temperature of the coolant flowing in the reactor core of a nuclear reactor comprises a γ-ray thermometer having a temperature measuring section arranged below the bottom of the reactor core and a γ-ray heat generation detecting section arranged between the bottom and the top of the reactor core, a cable for transmitting the signal output from the temperature measuring section and an output signal processing means for receiving the signal and computationally determining the local temperature of the coolant at the position of placement of the temperature measuring section.

6 Claims, 3 Drawing Sheets

APPARATUS AND METHOD FOR MEASURING A TEMPERATURE OF COOLANT IN A REACTOR CORE, AND APPARATUS FOR MONITORING A REACTOR CORE

CROSS REFERENCE TO RELATED APPLICATIONS

This application is based upon and claims the benefit of priority from the prior Japanese Patent Application No. 2005-268214, filed on Sep. 15, 2005, the entire contents of which are incorporated herein by reference.

BACKGROUND OF THE INVENTION

This invention relates to an apparatus for measuring the temperature of the coolant flowing in the reactor core of a nuclear reactor, a method for measuring the temperature of the coolant and an apparatus for monitoring a nuclear reactor.

In the boiling water reactor, a neutron detector is inserted into the reactor core from the bottom. To calibrate the sensitivity of the neutron detector, it has been proposed to combine a γ-ray thermometer and a neutron detector to observe the thermal power distribution of the nuclear reactor of the boiling water reactor (see Japanese Patent Publication No. 3556409 (the entire contents of which are incorporated herein by reference)).

A γ-ray thermometer is designed to measure the temperature difference within a detector due to the exothermic phenomena in the structural member attributable to γ-rays by a differential thermocouple. Since the amount of heat generation due to γ-rays is proportional to the thermal power of the nuclear reactor, it is possible to observe the axial thermal power distribution of the nuclear reactor by installing and arranging a plurality of detectors of γ-ray thermometers in the axial direction. Similarly, it is possible to observe the horizontal thermal power distribution of the nuclear reactor by installing and arranging a plurality of γ-ray thermometers at various horizontal positions.

A normal γ-ray thermometer contains a calibration heater so as to calibrate a differential thermocouple of a γ-ray thermometer by providing electricity to the calibration heater. By one of the methods for calibrating sensitivity with a calibration heater, the sensitivity is determined from the amount of emitted heat generated by the calibration heater and the change in the output signal of the differential thermocouple.

Meanwhile, although the temperature of the coolant flowing in the reactor core of a boiling water reactor is an important parameter for computationally evaluating the performance of the reactor core, the temperature indirectly observed at the coolant piping located outside the reactor is used for computationally evaluating the performance of the reactor core conventionally.

Conventional boiling water reactors do not have any means for directly observing the temperature of the coolant flowing in the reactor core that is an important parameter for computationally evaluating the performance of the reactor core. This lack of direct observation means is an error factor for computationally evaluating the performance of the reactor core. However, to install an in-core thermometer in order to observe the temperature of the reactor core coolant, it is necessary to modify the design of the existing reactor vessel. So, the design modification of the existing reactor vessel causes large increase of cost and is not a realistic choice.

Therefore, it is an object of the present invention to make it possible to directly observe the temperature of the coolant flowing in the reactor core in the nuclear reactor and monitor the nuclear reactor without modifying the design of the reactor vessel.

BRIEF SUMMARY OF THE INVENTION

The present invention has been made to solve the above problems, and has an object of making it possible to directly observe the temperature of the coolant flowing in the reactor core in the nuclear reactor and monitor the nuclear reactor without modifying the design of the reactor vessel.

According to an aspect of the present invention, there is provided an apparatus for measuring a temperature of coolant flowing in a reactor core contained in a reactor vessel, the apparatus comprising: a γ-ray thermometer having a γ-ray heat emission detector installed in the reactor core and a thermocouple thermometer installed out of the reactor core in the reactor vessel; and an output signal processor receiving a signal output from the thermocouple thermometer and computationally determining a local temperature of the coolant at the thermocouple thermometer.

According to another aspect of the present invention, there is provided an apparatus for measuring a temperature of coolant flowing in a reactor core contained in a reactor vessel, the apparatus comprising: a first temperature measuring apparatus having a delay in detection of a temperature change of the coolant less than or equal to an allowable delay criteria; a second temperature measuring apparatus having an error in measurement of a temperature of the coolant less than or equal to an allowable error criteria; and a signal processor regarding a first temperature computationally determined from a signal output from the first temperature measuring apparatus as the temperature of the coolant if a change per unit time of the first temperature exceeds the allowable delay criteria, and regarding a second temperature computationally determined from the signal output from the second temperature measuring apparatus as the temperature of the coolant if a change per unit time of the first temperature is less than or equal to the allowable delay criteria.

According to yet another aspect of the present invention, there is provided a method for measuring a temperature of coolant flowing in a reactor core contained in a reactor vessel, the method comprising: measuring a temperature at a position inside a γ-ray thermometer but outside the reactor core in the reactor vessel, the γ-ray thermometer having a γ-ray heat generation detector installed in the reactor core; and determining computationally a local temperature of the coolant from the temperature measured in the step of measuring.

According to yet another aspect of the present invention, there is provided a method for measuring a temperature of coolant flowing in a reactor core contained in a reactor vessel, the method comprising: regarding a first temperature computationally determined from a signal output from a temperature measuring apparatus having a delay in detection of a temperature change of the coolant less than or equal to an allowable delay criteria as the temperature of the coolant if a change per unit time of the first temperature exceeds the allowable delay criteria, and regarding a second temperature computationally determined from the signal output from a temperature measuring apparatus having an error in measurement of a temperature of the coolant less than or equal to an allowable error criteria as the temperature of the coolant if a change per unit time of the first temperature is less than or equal to the allowable delay criteria.

According to yet another aspect of the present invention, there is provided a Apparatus for monitoring a reactor core contained in a reactor vessel, the apparatus comprising: γ-ray thermometers categorized into groups according to their positions, the γ-ray thermometer each having a γ-ray heat generation detector installed inside the reactor core and a thermocouple thermometer installed outside the reactor core; an output signal processor receiving a signal output from the thermocouple thermometers and determining computationally a local temperatures of coolant at the positions of the thermocouple thermometers and an average temperature of each of the groups; and a diagnosing device diagnosing the nuclear reactor as in an abnormal condition if at least one of the average temperature, the change per unit time of any of the local temperatures and the deviation of any of the local temperatures from the average temperature exceeds a corresponding criteria.

BRIEF DESCRIPTION OF THE DRAWINGS

The above-described characteristics and advantages and other characteristics and advantages of the present invention will become apparent from the detailed description of preferred embodiments of the present invention given below by referring to the accompanying drawings.

DETAILED DESCRIPTION OF THE INVENTION

Now, the present invention will be described in greater detail by referring to the accompanying drawings that illustrate preferred embodiments of the invention.

Figure 1:
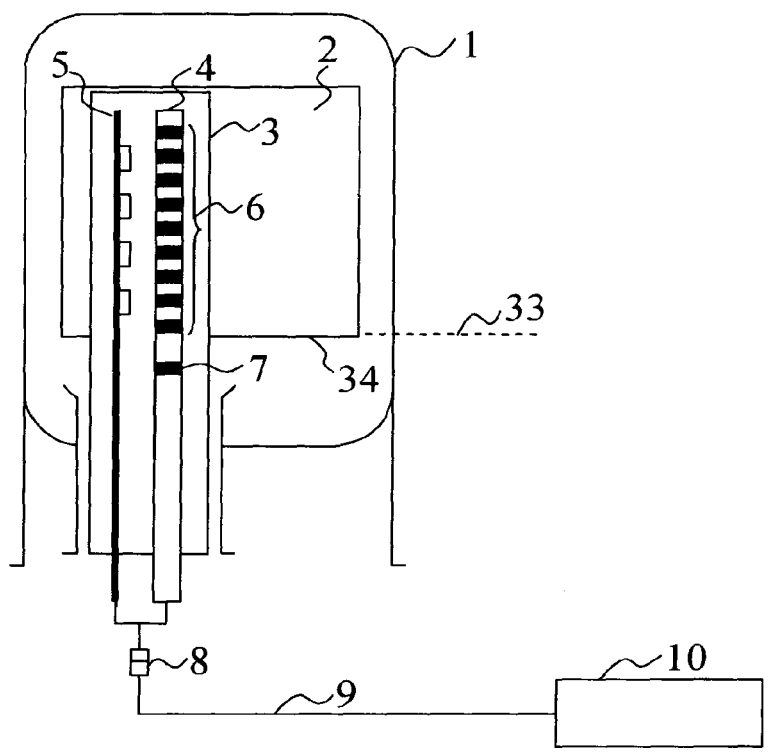
FIG. 1 is a schematic illustration of an embodiment of coolant temperature measuring apparatus according to the present invention.

FIG. 1 is a schematic illustration of an embodiment of coolant temperature measuring apparatus according to the present invention.

Inside a reactor vessel 1, there is a reactor core 2 where a plurality of fuel assemblies are arranged cylindrical space extending vertically. The reactor core 2 is supported by a core support plate 34. A neutron detector assembly 3 is inserted into the reactor core 2 from a bottom of the reactor vessel 1. The neutron detector assembly 3 contains inside a neutron detector 5 and a γ-ray thermometer 4. Note that, while only a single neutron detector assembly 3 is shown in FIG. 1, a plurality of neutron detector assemblies 3 are installed and arranged at various positions in the reactor core.

The γ-ray thermometer 4 includes a γ-ray heat generation detecting section 6 located in the reactor core 2 to measure a temperature difference due to the exothermic phenomenon attributable to γ-rays and a temperature measuring section 7 located lower than the bottom end of the reactor core 33 in the reactor vessel 1 where no exothermic phenomenon attributable to γ-rays takes place to measure the temperature of the coolant. The signals output from the neutron detector 5 and the γ-ray thermometer 4 are input to an output signal processing apparatus 10 through a multicore connector 8 and a multicore cable 9.

Figure 2:
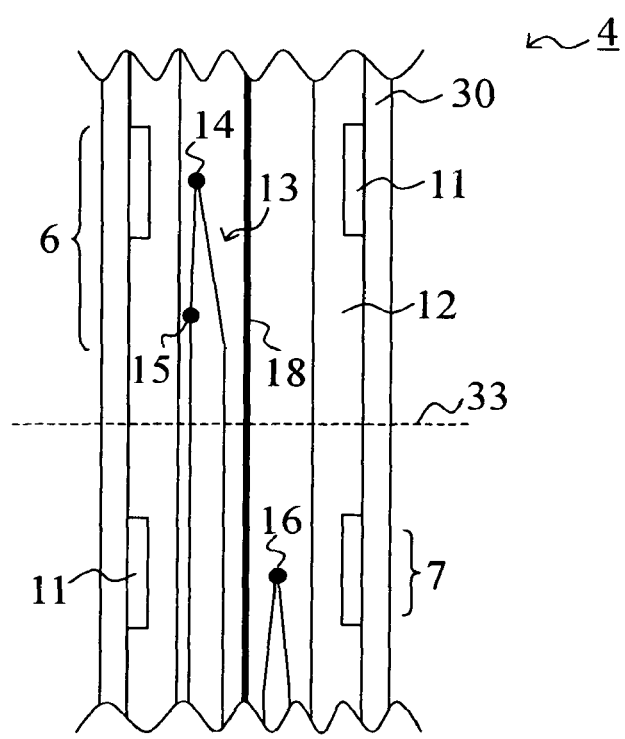
FIG. 2 is an enlarged schematic longitudinal cross sectional view of the γ-ray thermometer of FIG. 1.

FIG. 2 is an enlarged schematic longitudinal cross sectional view of the γ-ray thermometer 4 of the embodiment according to the present invention.

The γ-ray thermometer 4 includes a cylindrical structural member 12 in the inside of the detector container 30, a differential thermocouple 13 having a contact point located in the reactor core 2 and a thermocouple thermometer 16 having a junction located lower than a calibration heater 18 and the bottom end of the reactor core 33. The differential thermocouple 13 has a hot junction 14 and a cold junction 15. The structural member 12 is provided with a heat insulator 11 located at the same vertical position as the hot junction 14 of the differential thermocouple 13 and the thermocouple thermometer 16. The calibration heater 18 is located substantially at the center of the horizontal cross section of the detector container 30. The heat generator of the calibration heater 18 extends from a lower position than the thermocouple thermometer 16 to a higher position than the hot junction 14 and the cold junction 15 of the differential thermocouple 13.

Figure 3:
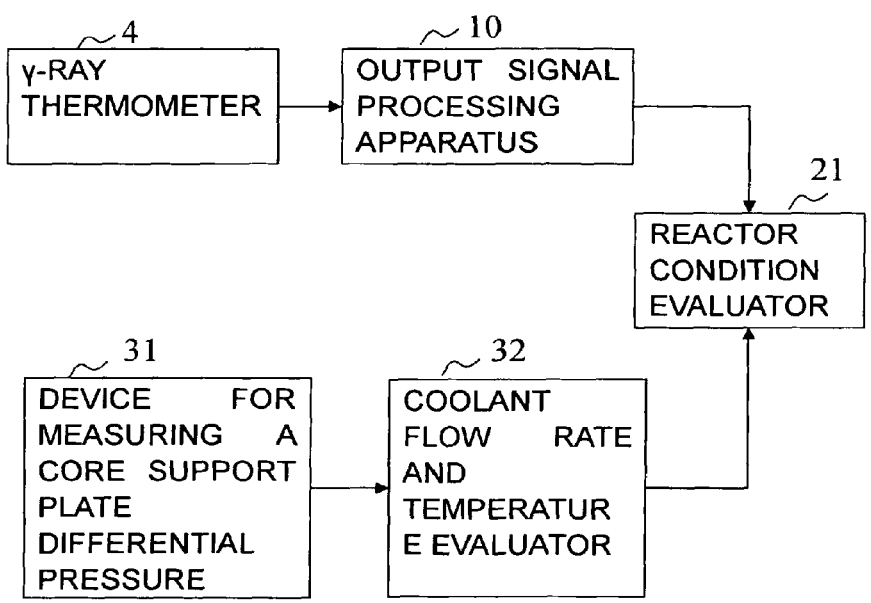
FIG. 3 is a schematic illustration of an embodiment of nuclear reactor monitoring apparatus according to the present invention.

FIG. 3 is a schematic illustration of an embodiment of nuclear reactor monitoring apparatus according to the present invention.

The nuclear reactor monitoring apparatus includes a reactor condition evaluator 21, an output signal processing apparatus 10, a γ-ray thermometer 4, a device for measuring a core support plate differential pressure 31 and a coolant flow rate and temperature evaluator 32. The γ-ray thermometer 4 is connected to the output signal processing apparatus 10 and the output signal processing apparatus 10 is connected to the reactor condition evaluator 21. The device for measuring the core support plate 31 differential pressure is connected to the coolant flow rate and temperature evaluator 32 and the coolant flow rate and temperature evaluator 32 is connected to the reactor condition evaluator 21.

Now, the method of measuring the coolant temperature by means of the embodiment of coolant temperature measuring apparatus and the method of monitoring the nuclear reactor by means of the embodiment of nuclear reactor condition monitoring apparatus will be described below.

Firstly, the differential thermocouple 13 and the thermocouple thermometer 16 are calibrated by using the calibration heater 18. As electricity is provided to the calibration heater 18, the calibration heater 18 generates heat and raises an internal temperature of the γ-ray thermometer 4. Heat generated by the calibration heater 18 hardly diffuses to the coolant in the vicinity of the heat insulator 11, whereas heat generated by the calibration heater 18 diffuses more to the coolant in areas where the heat insulator 11 is not located. Therefore, the temperature of the hot junction 14 of the differential thermocouple 13 becomes higher relative to the temperature of the cold junction 15 of the differential thermocouple 13 so that it is possible to determine the sensitivity of the differential thermocouple 13 from the amount of heat generated by the calibration heater 18 and the change in the output signal of the differential thermocouple 13.

The thermocouple thermometer 16 can be calibrated by using the calibration heater 18 like the calibration of the differential thermocouple 13. It is possible to determine the sensitivity of the thermocouple thermometer 16 from the amount of heat generated by the calibration heater 18 and the change in the output signal of the thermocouple thermometer 16. The heat insulator 11 is also located between the thermocouple thermometer 16 and coolant and heat generated by the calibration heater 18 hardly flows to the coolant so that the thermocouple thermometer 16 has a structure hardly influenced by the coolant during the calibration. Note, however, that it is possible to calibrate the thermocouple thermometer 16 even if there is no heat insulator 11 between the thermocouple thermometer 16 and coolant and hence the heat insulator 11 between the thermocouple thermometer 16 and coolant may be eliminated. If the heat insulator 11 between the thermocouple thermometer 16 and coolant is eliminated, the responsiveness to the temperature change of the coolant is improved, although the accuracy of calibration of the thermocouple thermometer 16 is degraded.

The differential thermocouple 13 and the thermocouple thermometer 16 may be calibrated simultaneously or independently.

During an operation of the nuclear reactor, the part of the structural member 12 in the detector container 30 that is located in the inside of the reactor core 2 generates heat due to γ-rays. Since the heat insulator 11 is located in the vicinity of the hot junction 14, heat generated in the structural member 12 due to γ-rays hardly flows to the coolant and hence the temperature of the vicinity of the hot junction 14 is higher than the temperature of the vicinity of the cold junction 15 where no heat insulator 11 is provided. Since the amount of heat generated in the structural member due to γ-rays is proportional to the thermal power of the nuclear reactor, it is possible to observe the axial distribution of the thermal power of the nuclear reactor by measuring the temperature difference by means of the plurality of differential thermocouples 13 located at various axial positions. In addition, it is possible to observe the horizontal distribution of the thermal power of the nuclear reactor by arranging a plurality of differential thermocouples 13, ie. neutron detector assemblies 3, at a various horizontal direction.

The temperature of the vicinity of the thermocouple thermometer 16 is same as that of the coolant because it is not influenced by γ-rays. Therefore, it can be assumed that the temperature computed by the output signal processing apparatus 10 by using the signal from the thermocouple thermometer 16 is equal to the local coolant temperature at the reactor core inlet in the vicinity of the thermocouple thermometer 16. However, it should be noted that, when the coolant temperature changes, there is a time lag until the temperature in the vicinity of the thermocouple thermometer 16 becomes equal to the changed temperature because heat flows through the detector container 30 and the structural member 12.

It is also possible to determine the coolant temperature at the reactor core inlet based on the thermal balance of the nuclear reactor by using the flow rate of the reactor core coolant determined from the differential pressure across the core support plate 34 that supports the reactor core. Then, the time lag will be smaller than that of the measurement of the thermocouple thermometer 16 but the error will be larger than that of the measurement of the coolant temperature by means of the thermocouple thermometer 16.

Thus, the reactor condition evaluator 21 evaluates the coolant temperature at the reactor core inlet by combining the two methods of measuring the coolant temperature by means of the thermocouple temperature 16. One of these methods has a high accuracy but the responsiveness of it to a temperature change is not very good. The other is a method of measuring the coolant temperature from the differential pressure across the core support plate 34, of which the accuracy is not very high but the responsiveness is good. More specifically, the reactor condition evaluator 21 has a function to use the coolant temperature of the reactor core inlet determined from the core support plate differential pressure if the change per unit time of the coolant temperature at the reactor core inlet determined from the core support plate differential pressure exceeds a predetermined criteria, or the coolant temperature at the reactor core inlet determined from the thermocouple thermometer 16 if the change per unit time of the coolant temperature at the reactor core inlet determined from the core support plate differential pressure doesn't exceed the criteria. This function enables to measure with a relatively large error but a high responsiveness if the coolant temperature at the reactor core inlet changes quickly and to the measure with a small error if the coolant temperature at the reactor core inlet changes mildly.

While the method of determining the coolant temperature at the reactor core inlet from the core support plate differential pressure is employed as a highly responsive method of measuring the coolant temperature and the method of measuring the coolant temperature by means of a thermocouple is employed as a highly accurate method of measuring the coolant temperature at the reactor core inlet in this embodiment, other measuring methods may alternatively be employed for the purpose of the present invention. For example, it is possible to increase the responsiveness of measuring the temperature of the coolant by contacting the thermocouple thermometer 16 with the container of the neutron detector assembly 3 and reducing the thickness of the container around the contact position. With this arrangement, the coolant temperature measured by means of the calibrated thermocouple thermometer 16 may have a large error because the influence of the coolant temperature is large during calibration of the thermocouple thermometer 16 but the change in the coolant temperature is transmitted to the thermocouple thermometer 16 more quickly.

The reactor condition evaluator 21 also has a function of diagnosing the soundness of a thermocouple thermometer 16 from the output of a plurality of thermocouple thermometers 16. The reactor condition evaluator 21 diagnoses the thermocouple thermometer 16 as out of order, if the deviation of the local coolant temperature at the reactor core inlet determined from the output of a thermocouple thermometer 16 exceeds a predetermined criteria from the average value of the coolant temperatures at the reactor core inlet determined from the outputs of the plurality of thermocouple thermometers 16. The average of the coolant temperature at the reactor core inlet can be determined by averaging the coolant temperatures determined from the outputs of all the thermocouple thermometers 16, or by averaging the coolant temperatures in each region by dividing the thermocouple thermometers 16 into groups according to their positions. It is possible to appropriately diagnose the soundness of the thermocouple thermometer 16 by averaging the coolant temperatures of each of the regions even if the coolant temperatures of the regions are different from each other.

When the nuclear reactor is operated in the normal condition, the coolant temperature at the reactor core inlet is not lower than the supplied water temperature and not higher than the saturated vapor temperature as determined from the pressure of the nuclear reactor. Therefore, a thermocouple thermometer 16 may be diagnosed as out of order if the difference between the local coolant temperature at the nuclear reactor inlet determined from the output of the thermocouple thermometer 16 and the above described average coolant temperature is greater than the difference of the saturated vapor temperature and the supplied water temperature. A thermocouple thermometer 16 may also be diagnosed as out of order if the coolant temperature determined from the output of the thermocouple thermometer 16 is lower than the supplied water temperature minus the measurement error of the thermocouple thermometer 16, or higher than the saturated vapor temperature plus the measurement error of the thermocouple thermometer 16.

Generally, the reactor core is arranged symmetrically. For example, fuel having the same irradiation history may be arranged in every ¼ of the reactor core with the center disposed at the vertical axis of the reactor core so that the same fuel arrangement appears if the reactor core is rotated by 90° around the vertical axis. In addition, the coolant flowing in the reactor core includes the coolant sent to the steam turbine, subsequently condensed by the condenser, heated and then supplied to the reactor core, and the coolant without being sent to the steam turbine but re-circulated in the reactor vessel 1 and flown into the reactor core. Since their temperatures differ from each other to a certain extent, the temperature of the coolant that flows into the reactor core can be dispersed. The dispersion depends on the flow of coolant and hence typically on the arrangement of reactor internals. The flow of coolant can also be regarded as symmetrical.

Therefore, if one of the thermocouple thermometers 16 goes out of order, the reactor condition evaluator 21 has a function to regard the local coolant temperature at the reactor core inlet determined from the output of the thermocouple thermometer 16 located at a position equivalent to the position of the thermocouple thermometer 16 that is out of order from the viewpoint of the above described symmetry (symmetrical position) as the local coolant temperature at the reactor core inlet of the thermocouple thermometer 16 that is out of order.

Additionally, the reactor condition evaluator 21 has a function of monitoring the nuclear reactor. It can detect that the coolant supplied to the reactor vessel is not heated, ie. a loss of feed water heating. If a loss of feed water heating occurs, the temperature of supplied water decreases and the average temperature of the coolant flowing into the reactor core decreases. So, the reactor condition evaluator 21 diagnoses that a loss of feed water heating occurs if the average temperature of the coolant at the reactor core inlet determined from the outputs of the thermocouple thermometers 16 of any of the above described groups, all the thermocouple thermometers 16 falls below a predetermined criteria, or if the amount of the decrease per unit time of the average of the coolant temperature at the reactor core inlet exceeds a predetermined criteria. Furthermore, if a loss of feed water heating occurs, the difference between the temperature of the coolant sent to the steam turbine and subsequently supplied to the reactor vessel and the temperature of the coolant flowing into the reactor core without being sent to the steam turbine increases. Therefore, the reactor condition evaluator 21 so diagnoses that a loss of feed water heating occurs if the dispersion of the local coolant temperature at the reactor core inlet determined from the outputs of a plurality of thermocouple thermometers 16, for example, the maximum value of the deviation of the local coolant temperature at the reactor core inlet from the average of the coolant temperature at the reactor core inlet, exceeds a predetermined criteria.

As described above, this embodiment of the present invention can measure the temperature of the reactor core coolant without modifying the design of any existing reactor vessel 1. Additionally, the output of the γ-ray heat generation detecting section 6 and that of the temperature measuring section 7 can be transmitted through one multicore connector 8 and one multicore cable 9 and can be sent to one output signal processing apparatus 10. Thus, it is possible to reduce the cost of hardware and the space for arranging hardware.

Additionally, both the sensitivity of the γ-ray heat generation detecting section 6 and that of the temperature measuring section 7 can be calibrated by a single calibration heater 18. Thus, it is possible to reduce the cost of hardware and the number of measuring operations of operators.

It is possible to measure the temperature of the coolant with an acceptable degree of both accuracy and responsiveness by using a measuring method of high responsiveness and low accuracy and a measuring method of low responsiveness and high accuracy so that the measuring method of high accuracy may be used in ordinary operating conditions but the measuring of high responsiveness may be used during the change of the operating conditions.

It will be appreciated that the above described embodiments are only examples and the present invention can be embodied in various different ways. While the above embodiments are described in terms of a boiling water reactor, they can be applied to a nuclear reactor of any other type. Additionally, the thermocouple thermometers 16 may be replaced by resistance thermometers.

What is claimed is:

1. A system, comprising:
    a reactor core;
    a γ-ray thermometer comprising:
        a container,
        a γ-ray heat generation detection section,
        a thermocouple thermometer, and
        a calibration heater,
            the γ-ray heat generation detection section contained in the container and located in the reactor core, the γ-ray heat generation detection section comprising:
                a cylindrical structural member contained in the container, the structural member provided with a heat insulator in the reactor core, part of the structural member that is located in the reactor core generating heat due to γ-rays, and
                a differential thermocouple contained in the structural member, the differential thermocouple including a hot junction located at a same vertical level as the heat insulator in the reactor core and a cold junction located at a vertical level lower than the heat insulator in the reactor core,
            the thermocouple thermometer contained in the structural member and located lower than a bottom of the reactor core,
        wherein the thermocouple thermometer measures the temperature of coolant flowing in the reactor core, and
        the calibration heater being installed inside the structural member, extending vertically at least between the γ-ray heat generation detection section and the thermocouple thermometer, and reaching the thermocouple thermometer; and
    an output signal processor receiving a signal output from the thermocouple thermometer and the differential thermocouple and computationally determining a local temperature of the coolant at the thermocouple thermometer.

2. The system of claim 1, wherein a plurality of thermocouple thermometers is provided and divided into groups according to their positions, and the output signal processor is configured to computationally determine an average temperature of coolant of each of the groups.

3. The system of claim 2, wherein the output signal processor is configured to diagnose a thermocouple thermometer as out of order if a deviation of the local temperature of coolant measured by the thermocouple thermometer from the average temperature of coolant exceeds a predefined criteria.

4. The system of claim 3, wherein the output signal processor is adapted to regard a local temperature of coolant, at a position symmetrical relative to the thermocouple thermometer diagnosed as out of order, as a local temperature of coolant at a position of the thermocouple thermometer diagnosed as out of order.

5. A system, comprising:
    a reactor core;
    γ-ray thermometers comprising:

respective containers, categorized into groups according to their positions, and respective γ-ray heat generation detection sections contained in the respective containers and located in the reactor core, the γ-ray heat generation detection sections each comprising:

a cylindrical structural member contained in the container, the structural member provided with a heat insulator in the reactor core, part of the structural member that is located in the reactor core generating heat due to γ-rays, and a differential thermocouple contained in the structural member, the differential thermocouple including a hot junction located at a same vertical level as the heat insulator in the reactor core and a cold junction located at a vertical level lower than the heat insulator in the reactor core, respective thermocouple thermometers contained in each respective structural member and located lower than a bottom of the reactor core, wherein the thermocouple thermometers measure the temperature of coolant flowing in the reactor core, and respective calibration heaters installed inside each respective structural member, extending vertically at least between the respective γ-ray heat generation detection sections and the respective thermocouple thermometers, and reaching the respective thermocouple thermometers;

an output signal processor receiving respective signal outputs from the thermocouple thermometers and the differential thermocouples and determining computationally local temperatures of coolant at positions of the thermocouple thermometers and an average temperature of each of the groups; and a diagnosing device diagnosing a nuclear reactor as being in an abnormal condition if at least one of the average temperature, a change per unit time of any of the local temperatures and a deviation of any of the local temperatures from the average temperature exceeds a corresponding criteria.

6. The system of claim 5, wherein the abnormal condition is loss of feed water heating.

\* \* \* \* \*